United States Patent
Lin et al.

(10) Patent No.: US 7,031,854 B2
(45) Date of Patent: Apr. 18, 2006

(54) UNIVERSAL POWER MEASUREMENT SOC AND MEASURING METHOD

(75) Inventors: Syh-Shoei Lin, Chang-Hua (TW); Wen-Liang Tseng, Taipei (TW); Jan-Ku Chen, Taipei (TW)

(73) Assignee: Industrial Technology Research Institute, Hsin-Chu (TW)

( * ) Notice: Subject to any disclaimer, the term of this patent is extended or adjusted under 35 U.S.C. 154(b) by 0 days.

(21) Appl. No.: 10/883,788

(22) Filed: Jul. 6, 2004

(65) Prior Publication Data

US 2005/0143961 A1 Jun. 30, 2005

(30) Foreign Application Priority Data

Dec. 25, 2003 (TW) .............................. 92136930 A (51) Int. Cl.
*G01R 21/00* (2006.01)
(52) U.S. Cl. ........................... 702/60; 702/64; 324/142
(58) Field of Classification Search ................. 702/57, 702/60–65, 79, 80, 99, 107, 130, 136, 127, 702/189, 190; 324/76.11, 76.13, 76.15, 76.38, 324/103 R, 142, 870.02, 870.04, 870.17, 324/637, 657, 136, 1 R, 2
See application file for complete search history.

(56) References Cited

U.S. PATENT DOCUMENTS

| 5,657,237 | A  | * | 8/1997  | Mazzoni ...................... 702/60 |
| 6,486,652 | B1 | * | 11/2002 | Ouellette et al. ........... 324/142 |
| 6,493,644 | B1 | * | 12/2002 | Jonker et al. ................. 702/61 |
| 6,577,191 | B1 |   | 6/2003  | Lin et al. ..................... 330/136 |
| 6,735,535 | B1 | * | 5/2004  | Kagan et al. .................. 702/61 |
| 6,784,806 | B1 | * | 8/2004  | Lee et al. .............. 340/870.02 |

FOREIGN PATENT DOCUMENTS

| CN | ZL01260623 | 5/2002 |
| TW | 188202 | 3/2002 |
| TW | 91221128 | 9/2003 |

* cited by examiner

*Primary Examiner*—Hal Wachsman
(74) *Attorney, Agent, or Firm*—Birch Stewart Kolasch & Birch LLP (57) ABSTRACT

A universal power measurement SoC includes an analog signal conditioning circuit, analog-to-digital converter circuit, memory and micro control unit. The analog signal conditioning circuit receives physical signals from a signal sensor and adjusts the polarities and amplitudes of the signals to produce suitable analog signals and gain status. The analog-to-digital converter circuit converts the adjusted analog signals into digital signals. The memory stores the pre-setup parameters of the power measurement. The micro control unit, according to users' choices, processes the converted digital signals with the gain status to produce the output signals of the power measurement.

12 Claims, 7 Drawing Sheets

| | Registers Descriptions | Name | | Registers Descriptions | Name |
|---|---|---|---|---|---|
| Data Output & Display Items | | | Output & Display Items of Status or Flag | | |
| 1 | Phase A Voltage | $V_A$ | 81 | Phase A & B Current Gain Status | $GS_{IAB}$ |
| 2 | Phase B Voltage | $V_B$ | 82 | Phase C & D Current Gain Status | $GS_{ICD}$ |
| 3 | Phase C Voltage | $V_C$ | 83 | Sag Status Output | Sag |
| 4 | Phase A RMS Voltage | $V_{rmsA}$ | 84 | Swell Status Output | Swell |
| 5 | Phase B RMS Voltage | $V_{rmsB}$ | 85 | Creep Status Output | CSF |
| 6 | Phase C RMS Voltage | $V_{rmsC}$ | 86 | Reverse Power Status Output | RPF |
| 7 | Phase A Peak Voltage | $V_{PA}$ | 87 | Kwh Pulse Output | F1 |
| 8 | Phase B Peak Voltage | $V_{PB}$ | 88~100 | Reserved | |
| 9 | Phase C Peak Voltage | $V_{PC}$ | | | |
| 10 | Phase A Current | $I_A$ | | | |
| 11 | Phase B Current | $I_B$ | Input Offset Data Items | | |
| 12 | Phase C Current | $I_C$ | 101 | Phase A Voltage DC Offset | $V_{OFFA}$ |
| 13 | Phase A RMS Current | $I_{rmsA}$ | 102 | Phase B Voltage DC Offset | $V_{OFFB}$ |
| 14 | Phase B RMS Current | $I_{rmsB}$ | 103 | Phase C Voltage DC Offset | $V_{OFFC}$ |
| 15 | Phase C RMS Current | $I_{rmsC}$ | 104 | Phase A Current DC Offset | $I_{OFFA}$ |
| 16 | Phase A Peak Current | $I_{PA}$ | 105 | Phase B Current DC Offset | $I_{OFFB}$ |
| 17 | Phase B Peak Current | $I_{PB}$ | 106 | Phase C Current DC Offset | $I_{OFFC}$ |
| 18 | Phase C Peak Current | $I_{PC}$ | 107 | Phase A Current Gain Offset | $GC_{OFFA}$ |
| 19 | Phase D Peak Current | $I_{PD}$ | 108 | Phase B Current Gain Offset | $GC_{OFFB}$ |
| 20 | Phase A Active Power | $W_A$ | 109 | Phase C Current Gain Offset | $GC_{OFFC}$ |
| 21 | Phase B Active Power | $W_B$ | 110 | Phase D Current Gain Offset | $GC_{OFFD}$ |
| 22 | Phase C Active Power | $W_C$ | 111 | Phase A phase Correction Angle | $\Theta_{OFFA}$ |
| 23 | Total Active Power | W | 112 | Phase B phase Correction Angle | $\Theta_{OFFB}$ |
| 24 | Phase A Reactive Power | $Var_A$ | 113 | Phase C phase Correction Angle | $\Theta_{OFFC}$ |
| 25 | Phase B Reactive Power | $Var_B$ | 114~130 | Reserved | |
| 26 | Phase C Reactive Power | $Var_C$ | | | |
| 27 | Total Reactive Power | Var | | | |
| 28 | Phase A Apparent Power | $S_A$ | | | |
| 29 | Phase B Apparent Power | $S_B$ | Input Setting Data Items | | |
| 30 | Phase C Apparent Power | $S_C$ | 131 | Phase A phase Delay | $\Theta S_A$ |
| 31 | Total Apparent Power | S | 132 | Phase B phase Delay | $\Theta S_B$ |
| 31 | Phase A Power Factor | $PF_A$ | 133 | Phase C phase Delay | $\Theta S_C$ |
| 32 | Phase B Power Factor | $PF_B$ | 134 | Phase A & B Current Gain | $GC_{IAB}$ |
| 33 | Phase C Power Factor | $PF_C$ | 135 | Phase C & D Current Gain | $GC_{ICD}$ |
| 34 | Total Power Factor | PF | 136 | Kwh to Pulse Output Threshold | EPTS |
| 36 | Phase A Kwh | $Kwh_A$ | 137 | Kwh to Pulse Output Ratio | EPRS |
| 37 | Phase B Kwh | $Kwh_B$ | 138 | Sag Threshold | $SS_{AG}$ |
| 38 | Phase C Kwh | $Kwh_C$ | 139 | Swell Threshold | $SS_{well}$ |
| 39 | Total Kwh | Kwh | 140 | Creep Protection Threshold | CPTS |
| 40 | Phase A Voltage Frequency | $F_{VA}$ | 141 | ADC Sampling Rate | $F_{ASS}$ |
| 41 | Phase B Voltage Frequency | $F_{VB}$ | 142 | Enable Channels On/Off | CSE |
| 42 | Phase C Voltage Frequency | $F_{VC}$ | 143 | Enable Power Monitor | PMSE |
| 43 | Phase A Current Frequency | $F_{IA}$ | 144 | Enable High Pass Filter On/Off | HPFE |
| 44 | Phase B Current Frequency | $F_{IB}$ | 145 | CT Ratio | CTR |
| 45 | Phase C Current Frequency | $F_{IC}$ | 146 | Enable Harmonic On/Off | HarE |
| 46 | Phase A Harmonic | $Har_A$ | 147 | uP Execution Functions | Upfs |
| 47 | Phase B Harmonic | $Har_B$ | 148 | LCD Display Items | LCDFS |
| 48 | Phase C Harmonic | $Har_C$ | 149 | Enable Reserved ROM & RAM | MEMOE |
| 49 | Ground Fault Current | $I_{GF}$ | 150 | Correction Temperature A & B | $TMP_{OFFAB}$ |
| 50 | Sag Event Time | $T_{SAG}$ | 151 | Correction Temperature A & B | $TMP_{OFFCD}$ |
| 51 | Swell Event Time | $T_{SWELL}$ | 152 | Power Outage Time | $T_{OUT}$ |
| 52 | Power Outage Event Time | $T_{POUT}$ | 153 | Enable SPI Output the Content of Registers | SPICtr |
| 53 | Temperature | TMP | 154~170 | Reserved | |
| 54~80 | Reserved | | | | |

FIG. 5

UNIVERSAL POWER MEASUREMENT SOC AND MEASURING METHOD

This Nonprovisional application claims priority under 35 U.S.C. § 119(a) on Patent Application No(s). 092136930 filed in TAIWAN, R.O.C. on Dec. 25, 2003, the entire contents of which are hereby incorporated by reference.

BACKGROUND OF THE INVENTION

1. Field of the Invention

The present invention generally relates to a programmable power measurement chip, and more particularly to universal power measurement chip architecture that external apparatuses can pre-setup required functions.

2. Description of the Prior Art

Power measurement circuits are applied in various measurement devices and industrial control apparatuses to convert analog power signals (such as voltage, current, . . . ) into digital power signals for further processing.

Figure 1:
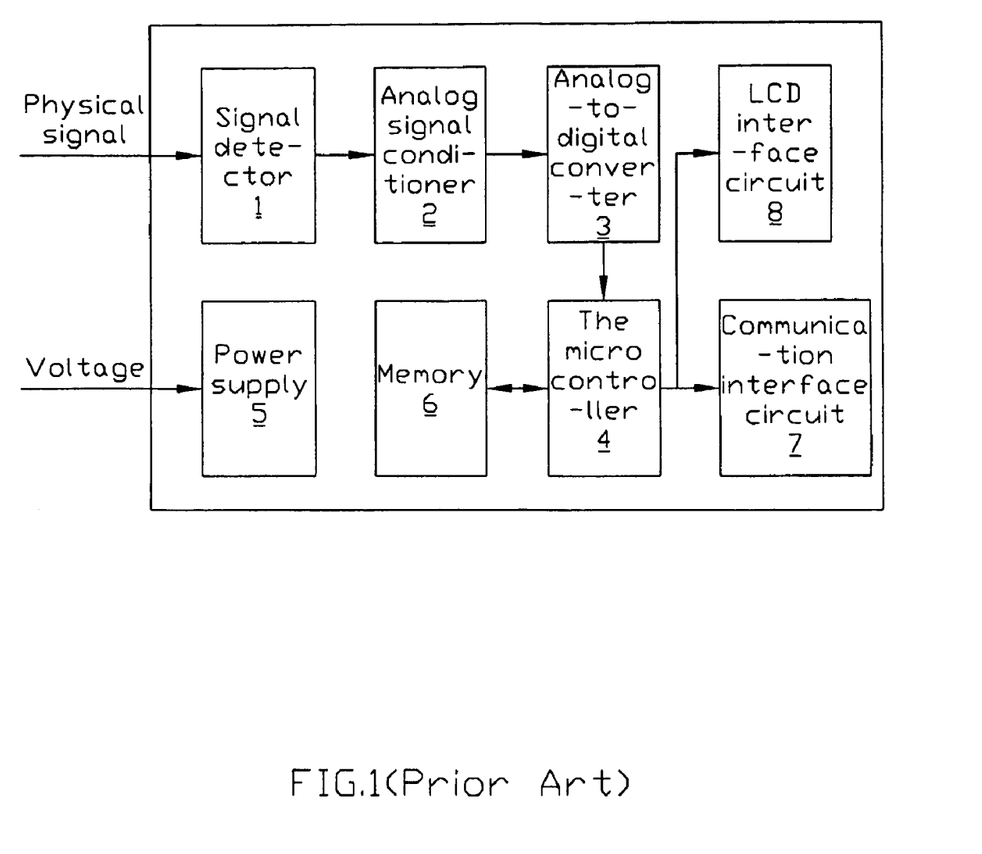
FIG. 1 is a diagram of the basic architecture of the prior art of voltmeters, ammeters, . . . etc.

The architecture of the prior art of power measurement devices, such as voltmeters and ammeters, as shown in FIG. 1, includes a signal detector 1, an analog signal conditioner 2, an analog-to-digital converter 3, a micro controller 4, a power supply 5, a memory 6, a communication interface 7, and an LCD interface 8.

The signal detector 1 can convert physical (analog) signals into voltage signals. After the signal conditioner 2 adjusts the voltage signals into proper amplitude, the analog-to-digital converter 3 converts the adjusted analog signals into digital signals. The micro controller 4 processes the digital signals in accordance with the pre-setup programs. The processed power information can be saved in the memory 6, shown in the external LCD through the LCD interface 8, or directed to an external storage apparatus through the communication interface 7. The power supply 5 is a battery for a handhold meter, or a linear or switching power supply for built-in meter to supply the needed power for each circuit.

The mentioned prior art of the circuitry architecture is applied in a voltmeter, then the signal detector 1, analog signal conditioner 2, analog-to-digital converter 3, and programs in the micro controller 4 have to be designed for the characteristics of the voltage measurement. If the architecture is applied in the other power measurements, all the above circuitry and programs have to be redesigned. It lacks flexibility in application. Once the architecture is applied in a universal integrated power measurement apparatus, all of the desired signal detector 1, analog signal conditioner 2, and analog-to digital converter 3 have to be incorporated in a single system. Besides, if the micro controller 4 is designed to execute a variety of the power measurement programs, it is necessary to have a processing procedure to arrange the various programs properly to avoid the conflict of the execution. Consequently, the volume of the measurement apparatus is getting much bigger, and the hardware is getting more complicated to increase the chances of the interferences among the programs. Therefore, the prior art of the circuitry architecture is always a big burden for designers and manufacturers, because they have to design and manufacture the meters for each different use according to the need of the market, in no way to respond to the real-time requirement.

SUMMARY OF THE INVENTION

Obviously, the prior art can not satisfied the design and manufacturing. Accordingly, flexible system chip architecture with optional execution functions as a core of a power measurement apparatus is provided. Users use this chip architecture as the system core of their power measurement apparatus, and then they can select the required measurement functions by the power parameters, values, or input/output setup table of flags from external apparatuses. Or they can input new functions to the chip by the setup procedure of the power operating functions, also re-setup the built-in parameters by transferring data through the communication interface.

A further object of the present invention is the provision of a programmable power measurement chip to integrated all the elements in a single chip to reduce the volume. To satisfied the requirements of the IEC 60687, IEC 60256 and ANSI C12.20, the present invention can decrease the number of the necessary components, improve the system stability, reduce the calibration procedure of precision, simplify the manufacturing process, cut down the cost, and increase the flexibility of application.

A universal power measurement chip, a system-on-chip (SoC), with programmable execution functions including an analog signal conditioning circuit, analog-to-digital converter, memory and micro controller is provided. The analog signal conditioning circuit can receive an input signal and adjust the signal to generate an adjusted signal with proper amplitude or polarity and a gain status signal. The analog-to-digital converter converts the adjusted signal into digital signal. The memory is used to save the certain pre-setup power parameters. The micro controller processes the converted digital signal to obtain a power measurement output signal according to the measurement items selected by a user, one of the items of the power parameters and the gain status signal.

BRIEF DESCRIPTION OF THE DRAWINGS

For a better understanding of the invention as well as other objects and features thereof, reference is made to the following detailed description to be read in conjunction with the accompanying drawings, wherein:

FIG. 4, as shown in the three views of FIGS. 4A, 4B, and 4C, is the flowchart of the selection, setup and execution of the functions of the present invention.

DESCRIPTION OF THE PREFERRED EMBODIMENT

Figure 2:
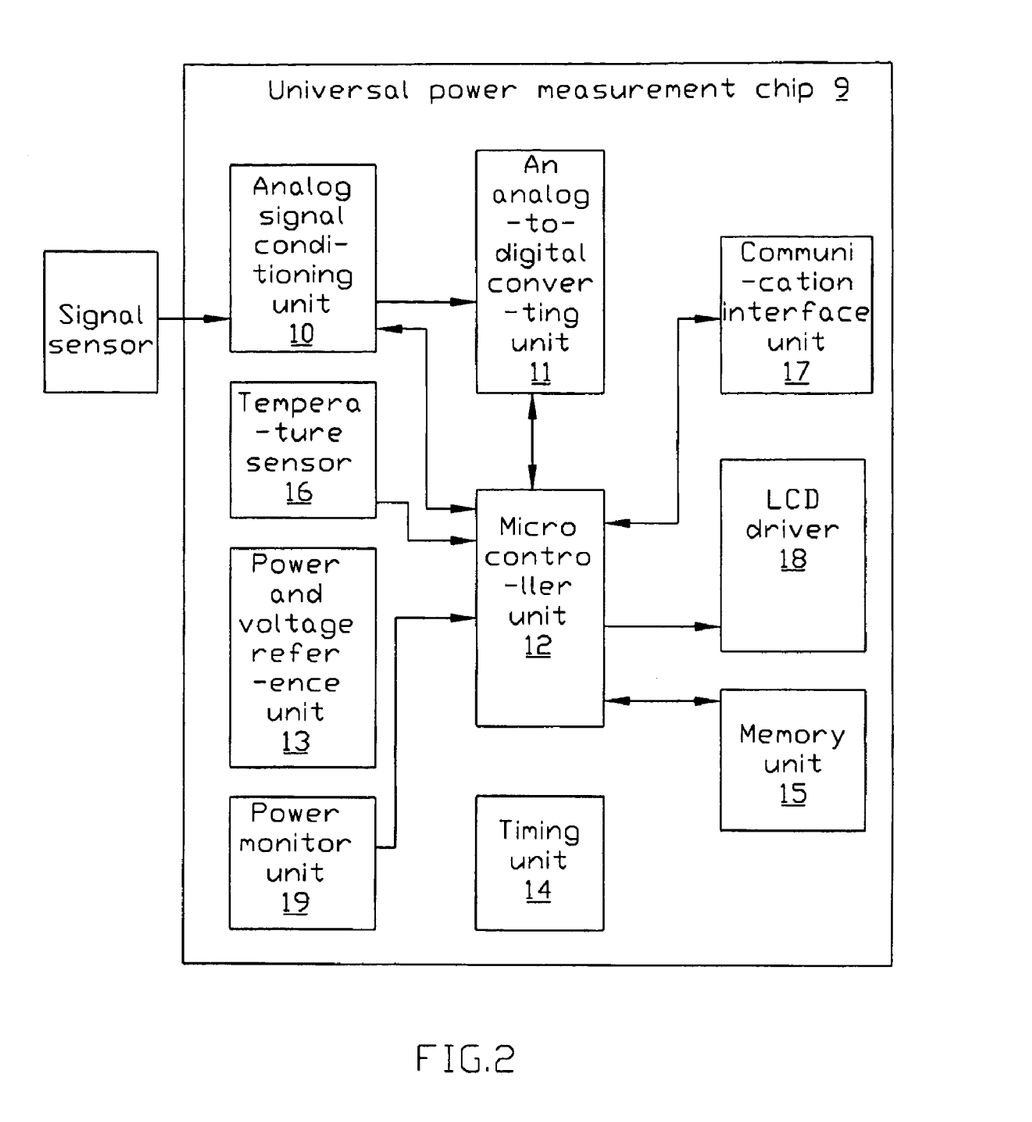
FIG. 2 is a diagram of the architecture of a universal power measurement chip with programmable execution functions.

Referring to the FIG. 2, it is a diagram of an SoC embodiment of the present invention to illustrate the architecture of a universal power measurement chip. A universal power measurement chip 9 includes an analog signal conditioning unit 10, an analog-to-digital converting unit 11, a micro controller unit 12 and a memory unit 15. A universal power measurement apparatus with programmable execution functions can be set up by means of the universal power measurement chip 9 working with an external signal detector, power supply, LCD, communication peripheral circuit and setup keys.

Optionally, the universal power measurement chip 9 further includes a power and voltage reference unit 13, timing unit 14, temperature sensor 16, communication interface unit 17, LCD driver 18, and power monitor unit 19. The power and voltage reference unit 13 receives and stabilizes an external power to provide the stable power for the operation of the universal power measurement chip 9 and reference voltage source for the analog signal conditioning unit 10 and analog-to-digital converting unit 11. In one embodiment, the power and voltage reference unit 13 includes a power stabilizer and a voltage reference input/output circuit. And the timing unit 14 includes a real-time clock circuit, a watchdog timer circuit, and a timing generation circuit to provide the timing for the operation of every part of the universal power measurement chip 9.

The temperature sensor 16 works with the memory 15 to set up and pass the temperature compensated point to the micro controller unit 12 as the basis of the compensation for the power parameter calculation of the micro controller unit 12. The temperature sensor 16 also provides the real-time temperature value and passes the value to the memory 15 to save to wait for outputting if needed. Besides, the communication interface unit 17 includes a general-purposed input/output interface, pulse and flag input/output interface, synchronous serial communication interface, asynchronous serial communication interface, and a parallel communication interface to pass the interface data provided by the universal power measurement chip 9 to the external apparatus.

The power monitor unit 19 monitors the supply status of the power and pass the data to the micro controller unit 12 to judge. If the supply of the power is abnormal, the measurement is paused, and the measured data is written to the memory 15 to save internally to avoid the data loss because of the power cut. And the LCD driver 18, controlled by the micro controller unit 12, displays various power data on the LCD in accordance with the pre-selected data item.

In an embodiment of the present invention, the analog signal conditioning unit 10 is responsible for receiving an analog signal to adjust the signal into a voltage/current signal with proper polarity and amplitude, and outputting the adjusted voltage/current signal and a gain control signal. In one embodiment, the analog signal is the physical signal, like voltage, current or pressure, that is received and generated by an external signal detect device. And the signal conditioning unit 10 includes an analog signal conditioning circuit with fixed gain and self-adjusted gain to generate a set of gain control signals. It can make the analog signal become a voltage/current signal with proper polarity and amplitude by means of the amplifying/attenuating the gain control signal to automatically adjust the amplification and attenuation of the input signal.

An embodiment of the analog signal conditioning unit 10 refers to the patents of the same applicant as the one of the present invention: ROC Application No. 091221128, filed Dec. 25, 2002, entitled "Analog Signal Section Auto Control Circuit"; ROC novelty Patent No. 188202, filed Dec. 15, 2000, entitled "Automatic Gain Control Circuit For Analog Signals"; U.S. Pat. No. 6,577,191, filed Nov. 8, 2001, entitled "Automatic Gain Control Circuit For Analog Signals"; and China novelty Patent No. ZL01261062-3 filed Sep. 7, 2001, entitled "Automatic Gain Control Circuit For Analog Signals".

The analog-to-digital converting unit 11, connected with the analog signal conditioning unit 10, receives the adjusted voltage/current signals, samples and holds the adjusted voltage/current signals to convert into digital signals, and then outputs the digital voltage/current signals. The micro controller unit 12 is used for calculation, judgment, control of display, and control of communication. The micro controller unit 12 also receives the gain status signals coming from the analog signal conditioning unit 10 and the digital signals coming from the analog-to-digital converting unit 11. And then the pre-selected power parameter calculation function and the output temperature compensation value saved in the memory 15 are read to be processed with the digital signals and the gain status signals for ensuring that the result is accordance with the amplitude of the external signals and the power information is correct.

Figure 3:
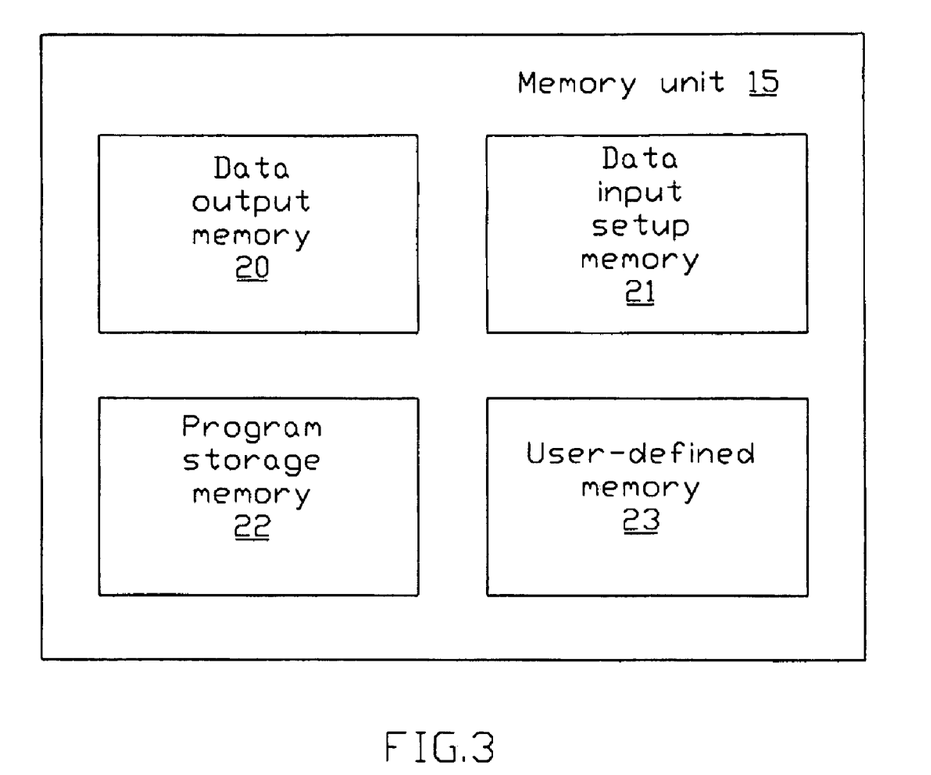
FIG. 3 further shows the configuration of the memory in FIG. 2.

Referring to FIG. 3, the embodiment of the memory 15 of the present invention, configured by the character of the information with the required storage addresses and length, includes a data output memory 20, a data input setup memory 21, a program storage memory 22, and a user-defined memory 23. In this embodiment, the data output memory 20 works as a temporary storage to provide certain options, such as power parameter values, quality of the power harmonic, measuring temperature, and power status. The data input setup memory 21 works as an eternal storage to provide the input options, such as the setup of the threshold value of the Wh-to-Pulse, Creep, Sag, Swell and Power Outage Time, the converting ratio of the Phase Correcting Angle, Wh-to-Pulse, Gain, and sampling rate, the on/off of the HPF, Channel, and BlankROM, the status of CT and the setup of the temperature compensation.

The program storage memory 22, working for storing programs, stores the operation programs and options of the power parameters, the programs and options of the communication protocol, and the display programs and options of the LCD. In this embodiment, the built-in parameter operation program set and options includes communication protocol, data transportation, real-time calculation of the power parameters (Vrms, Irms, Vpeak, Ipeak, W, S, Var, PF, and Line Frequency), parameters for calibration (Gain, DC offset, Phase Correction, FFT, and measuring temperature), and LCD display parameters (power parameters, quality of the power harmonic, temperature, and power status). And the user-defined memory 23 is an empty memory to store programs and data. Users can input the needed programs and data in this area by themselves.

Figures 4, 4A:
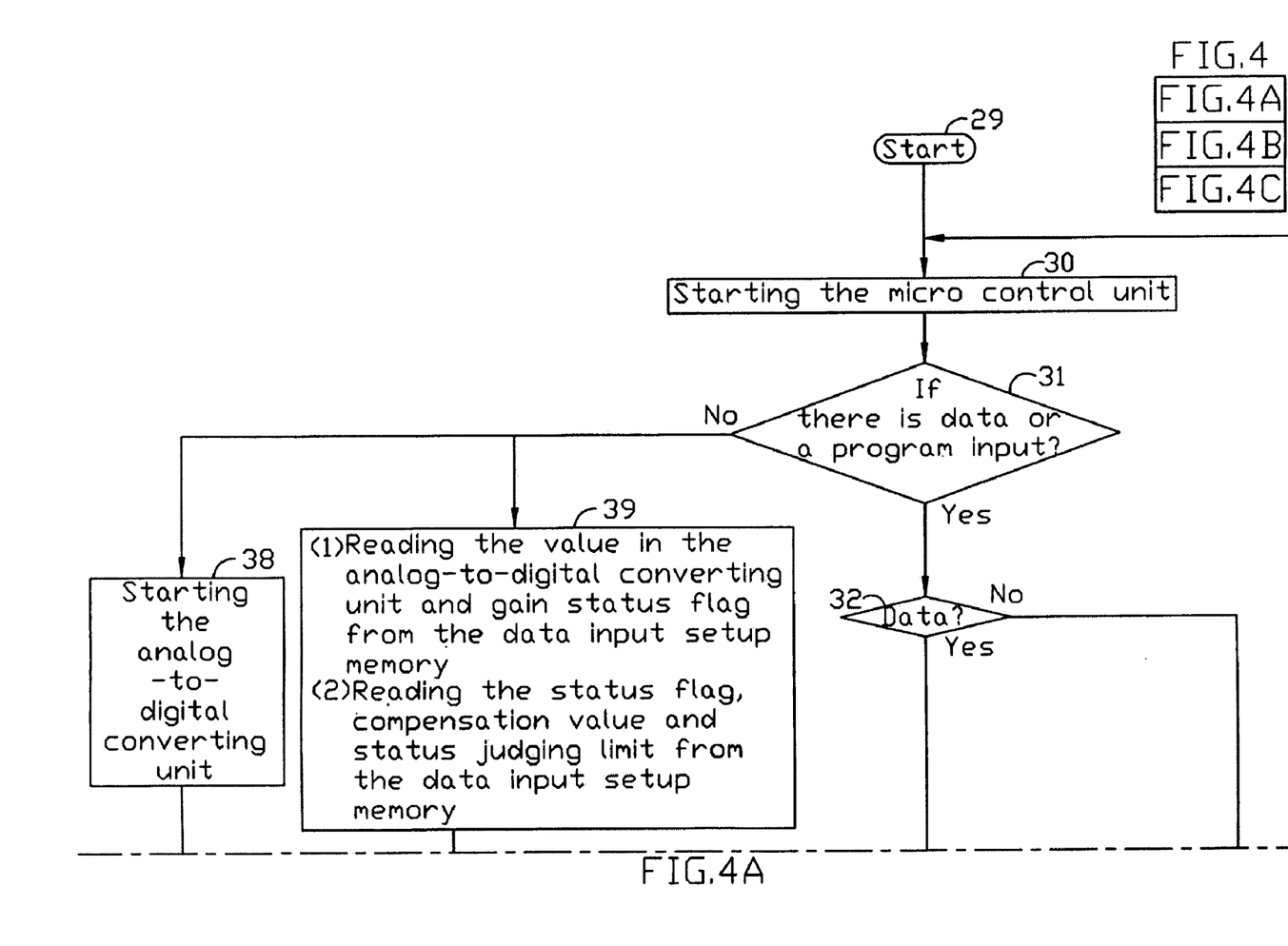
Figure 4B:
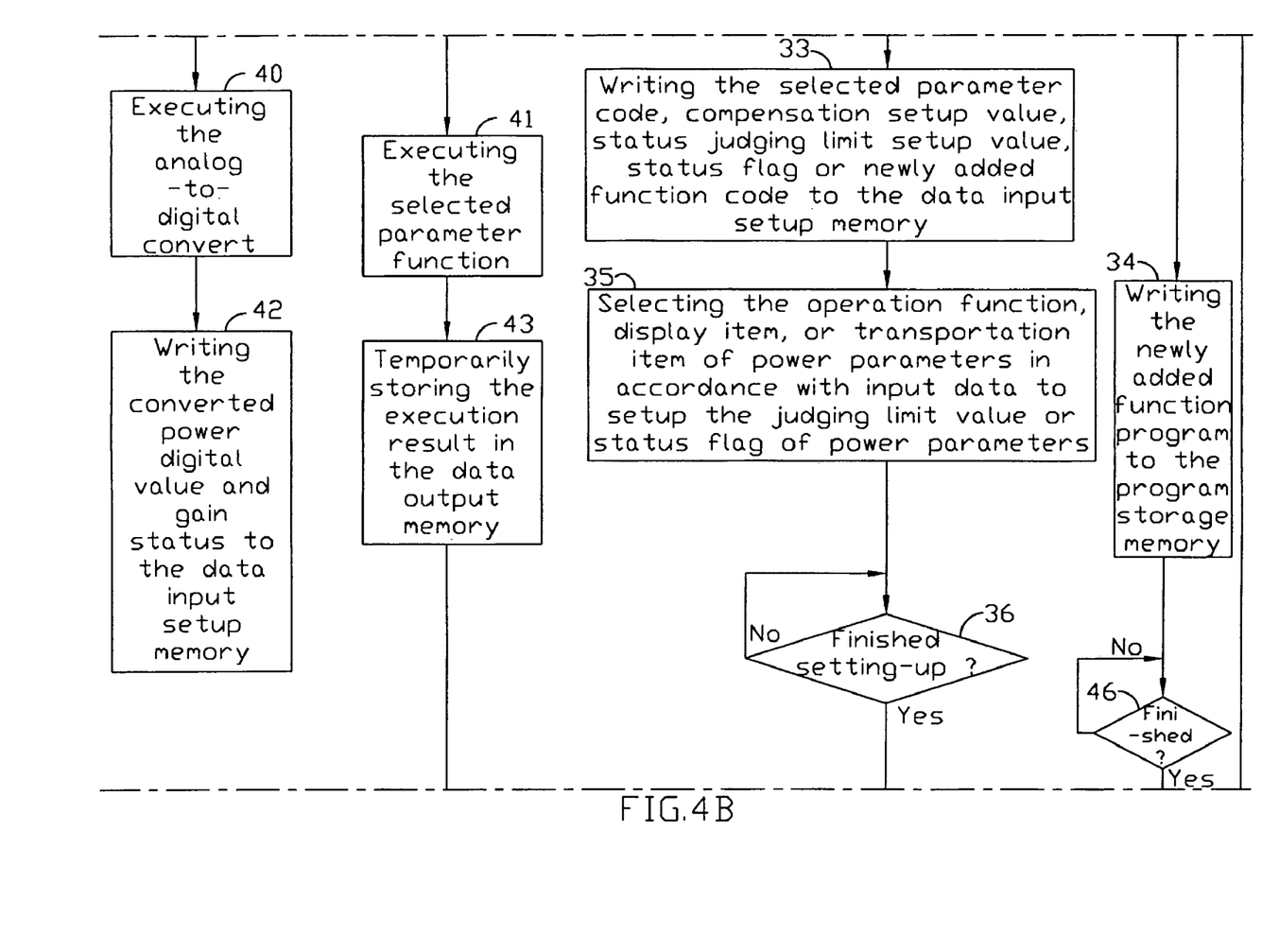
Figure 4C:
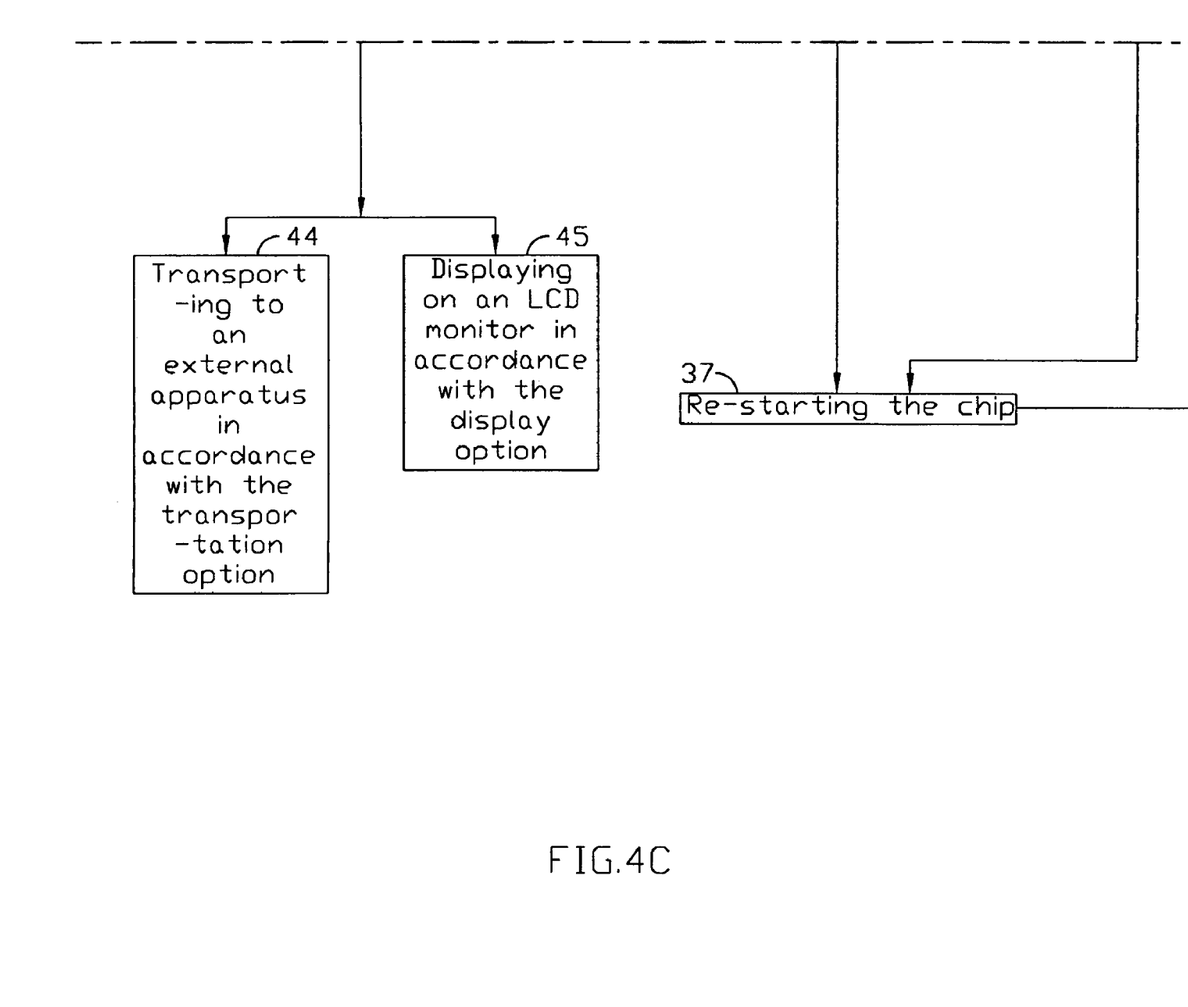

The other objects and their architecture designs of the present invention are illustrated in the next embodiment. FIG. 4, as shown in the three views of FIGS. 4A, 4B, and 4C. shows the procedure of the setup and execution of the functions of the chip. After starting, the chip is in the starting micro control unit state (step 30), ready for receiving the input from the external apparatus, and also inform the external apparatus that the chip is ready for receiving. After informed, the external apparatus transports a piece of beginning protocol, including the character of the input. The chip determines the character of the input in accordance with the protocol, and then starts receiving.

Then the input is judged if it is information (step 32). The input will be saved in the data input setup memory 21 (step 33), if the input is a power parameter operation execution option code, status flag, compensation setup value, judging limit value, transportation option, or display option. Unless the data input setup memory 21 is re-setup, the data will not be updated. If the input is a newly added function, it will be saved in the program storage memory 22 (step 34). Unless the program storage memory 22 is re-setup, the program will not be updated. In the mean time, a new function code will be sent to the data input setup memory 21 to wait for being read by the micro control unit 12 (step 35). The external apparatus will send a piece of ending protocol to inform the chip that the transportation is done and the chip will restart (step 37) after the external apparatus finishes sending (step 36).

Once the chip restarts, the micro control unit 12 will restart as well, and drive the analog-to-digital converting unit 11 (step 38) to execute the analog-to-digital convert (step 40), read the power parameter operation execution option code, status flag, compensation setup value, judging limit value, transportation option, or display option from the data input setup memory 21 (step 39), and wait for reading the information, like analog-to-digital converting value and gain status flag. After finishing converting, the analog-to-digital converting unit 11 will immediately write the converting value into the data input setup memory 21 (step 42) to wait for being read by the micro control unit 12. The micro control unit 12 will proceed to operation or judgment in accordance with the power parameter operation execution program, and then save the execution result in the data output memory 21 (step 43). The first step result of the operation will be adjusted in accordance with the status flag, judging limit value, and compensation setup value. Then the micro control unit 12 sends the last result to the external storage (step 44) or to show on the LCD (step 45) by driving the communication interface unit 17 or LCD driver 18 in accordance with the transportation option and display option. By following the procedure, the chip operates continuously until re-setting-up functions.

Figure 5:
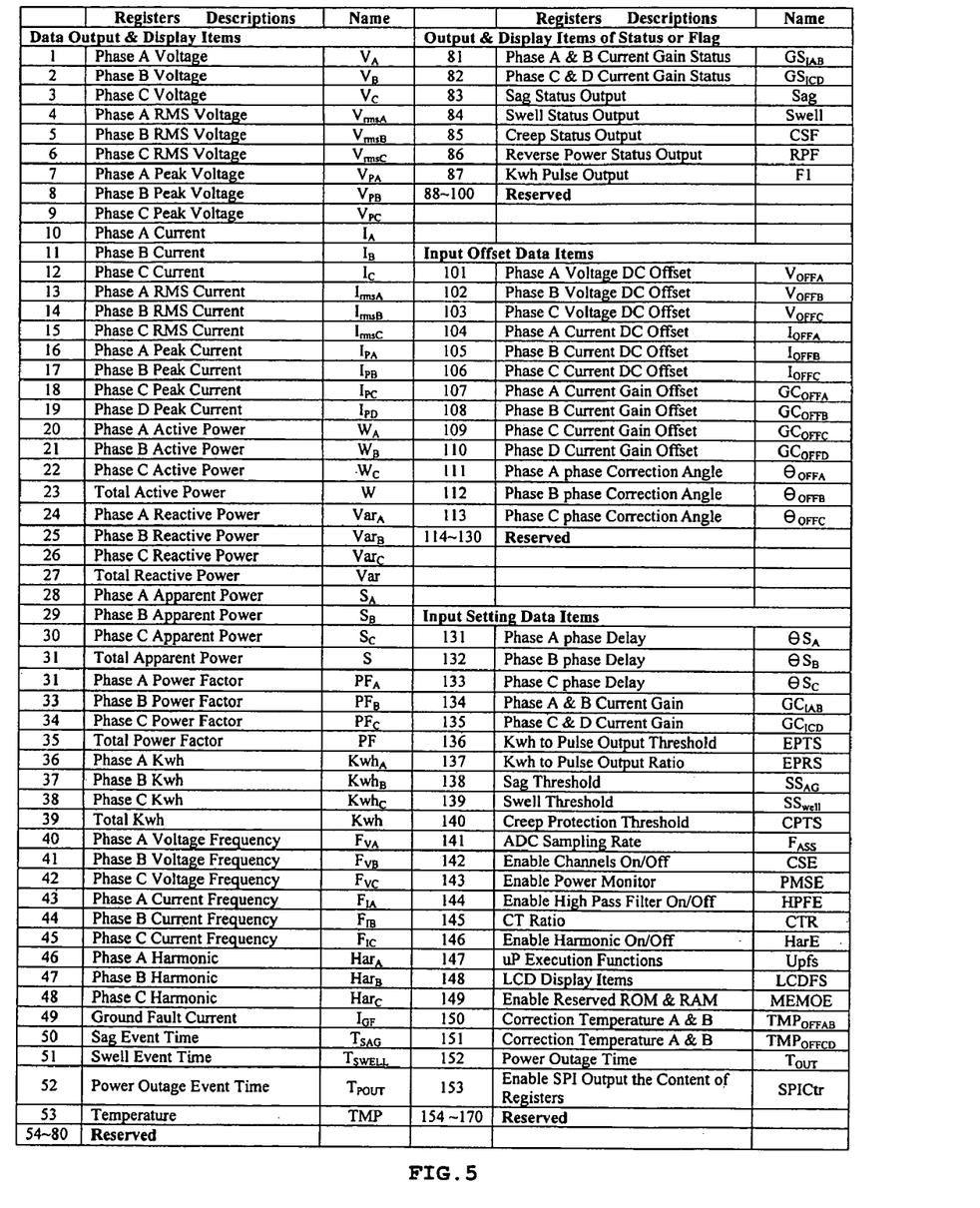
FIG. 5 is a setup table about the input/output of power parameters, values, and flags in an embodiment.

FIG. 5 is a setup table about the input/output of power parameters, values, and flags in an embodiment. With the setup table and the above, the universal power measurement chip architecture with programmable execution functions of the present invention can simplify the design of the firmware and hardware of a power measurement apparatus, and build a low cost apparatus with flexible options to respond to requirements. Therefore, the present invention is very valuable in industry.

It is further understood by those skilled in the art that the foregoing description is a preferred embodiment of the disclosed device and that various changes and modifications may be made in the invention without departing from the spirit and scope thereof.

What is claimed is:

1. A universal power measurement chip with programmable execution functions including:
   an analog signal conditioning unit to receive and adjust a detected input signal to generate an adjusted signal with an appropriate amplitude or polarity and a gain status signal;
   an analog-to-digital unit to convert the adjusted signal to a digital signal;
   a memory to store a plurality of power parameter items; and
   a micro control unit according to one of a plurality of power parameter operation programs to process the digital signal to obtain a power measurement output signal in accordance with a measurement option of a user's choice, one of the plurality of power parameter items, and the gain status signal;
   wherein the programmable execution functions are functions of the plurality of power parameter operation programs, and the plurality of power parameter items comprise power parameters for real-time calculation, parameters for calibration and LCD display parameters.

2. The universal power measurement chip with programmable execution functions as recited in claim 1, further including a power and voltage reference unit to receive an external power and provide a reference voltage for the analog signal conditioning unit and the analog-to-digital unit.

3. The universal power measurement chip with programmable execution functions as recited in claim 1, further including a timing unit to provide a timing for the universal power measurement chip with programmable execution functions.

4. The universal power measurement chip with programmable execution functions as recited in claim 1, further including a temperature sensor to transport a measured temperature value to the micro control unit with a setup temperature compensation point in the memory as a base of a compensation of power parameter calculation.

5. The universal power measurement chip with programmable execution functions as recited in claim 1, further including an communication interface unit to transport the power measurement output signal to an external apparatus.

6. The universal power measurement chip with programmable execution functions as recited in claim 1, further including an LCD driver to transport a power information of the power measurement output signal on a screen.

7. The universal power measurement chip with programmable execution functions as recited in claim 1, wherein the memory includes a data output memory, a data input setup memory, a program storage memory, and a user-defined memory.

8. The universal power measurement chip with programmable execution functions as recited in claim 7, wherein the data output memory stores the measurement items comprising power parameter values, quality of the power harmonic, measuring temperature, and power status.

9. The universal power measurement chip with programmable execution functions as recited in claim 7, wherein the program storage memory stores the plurality of power parameter operation programs and the plurality of power parameter items.

10. A universal power measurement method with programmable execution functions including:
    providing a memory to store a plurality of power parameter items;
    receiving a detected input signal from an external signal detector;
    adjusting the detected input signal to generate an adjusted signal with an appropriate amplitude or polarity and a gain status signal;
    converting the adjusted signal to a digital signal; and
    processing the digital signal according to one of a plurality of power parameter operation programs, to obtain a power measurement output signal in accordance with a measurement option of a user's choice, one of the plurality of power parameter items, and the gain status signal;
    wherein the programmable execution functions are functions of the plurality of power parameter operation programs, and the plurality of power parameter items comprise power parameters for real-time calculation, parameters for calibration and LCD display parameters.

11. The universal power measurement method with programmable execution functions as recited in claim 10, further including displaying data of the power measurement output signal on a screen.

12. The universal power measurement method with programmable execution functions as recited in claim 10, further including receiving an external measurement item input by a user.

* * * * *